(12) United States Patent
Qiang et al.

(10) Patent No.: US 11,362,072 B2
(45) Date of Patent: Jun. 14, 2022

(54) LIGHT EMITTING DIODES HAVING DIFFERENT SHAPES WITH EACH HAVING CORRESPONDING SHAPE WITH RESPECTIVE PIXEL DEFINING LAYER OPENINGS AND A TRANSFER METHOD THEREOF

(71) Applicant: BOE Technology Group Co., Ltd., Beijing (CN)

(72) Inventors: Li Qiang, Beijing (CN); Zhaohui Qiang, Beijing (CN); Tao Yang, Beijing (CN); Dongsheng Yin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/904,584

(22) Filed: Jun. 18, 2020

(65) Prior Publication Data
US 2021/0020613 A1    Jan. 21, 2021

(30) Foreign Application Priority Data
Jul. 17, 2019    (CN) .......................... 201910643338.1

(51) Int. Cl.
*H01L 33/00* (2010.01)
*H01L 25/075* (2006.01)
*H01L 25/16* (2006.01)

(52) U.S. Cl.
CPC ........ *H01L 25/0753* (2013.01); *H01L 25/167* (2013.01)

(58) Field of Classification Search
CPC ... H01L 25/0753; H01L 25/167; H01L 33/38; H01L 33/62; H01L 33/20; H01L 27/156; H01L 21/67144; H01L 21/6833
See application file for complete search history.

(56) References Cited

U.S. PATENT DOCUMENTS

| | | | |
|---|---|---|---|
| 11,079,890 B2 * | 8/2021 | Jeong | G06F 3/04164 |
| 2013/0210194 A1 | 8/2013 | Bibl et al. | |
| 2013/0214302 A1 | 8/2013 | Yeh et al. | |

(Continued)

FOREIGN PATENT DOCUMENTS

| | | |
|---|---|---|
| CN | 104115266 A | 10/2014 |
| CN | 107146769 A | 9/2017 |

(Continued)

OTHER PUBLICATIONS

Office Action dated Mar. 23, 2021 for Chinese Patent Application No. CN201910643338.1 and English Translation.

*Primary Examiner* — Ismail A Muse
(74) *Attorney, Agent, or Firm* — Ling Wu; Stephen Yang; Ling and Yang Intellectual Property

(57) ABSTRACT

A light emitting diode, a display substrate and a transfer method are disclosed. The transfer method includes: disposing a display substrate on an adsorption carrier plate, and absorbing, by a transport head, multiple light emitting diodes from a donor substrate; dropping, by the transport head, the multiple light emitting diodes onto the display substrate, the light emitting diodes falling into positioning holes on the display substrate; and absorbing and removing, by the transport head, a light emitting diode on the display substrate which does not fall into a positioning hole.

19 Claims, 4 Drawing Sheets

(56) References Cited

U.S. PATENT DOCUMENTS

| | | | |
|---|---|---|---|
| 2014/0159066 A1 | 6/2014 | Hu et al. | |
| 2017/0358640 A1* | 12/2017 | Park | H01L 51/525 |
| 2018/0197899 A1 | 7/2018 | Bae et al. | |
| 2018/0219123 A1 | 8/2018 | Wang et al. | |
| 2018/0342643 A1 | 11/2018 | Lu et al. | |
| 2019/0088168 A1* | 3/2019 | Choi | H01L 33/62 |
| 2019/0189604 A1* | 6/2019 | Lu | H01L 22/20 |
| 2019/0252637 A1* | 8/2019 | Wu | H01L 51/5253 |
| 2020/0058533 A1 | 2/2020 | Zou et al. | |
| 2020/0328332 A1* | 10/2020 | Song | H01L 33/56 |
| 2020/0388736 A1* | 12/2020 | Chen | H01L 22/22 |
| 2021/0050388 A1* | 2/2021 | Song | H01L 27/3272 |
| 2021/0050557 A1* | 2/2021 | Yun | H01L 27/3246 |
| 2021/0191541 A1* | 6/2021 | Yang | G06F 3/044 |

FOREIGN PATENT DOCUMENTS

| | | |
|---|---|---|
| CN | 107833526 A | 3/2018 |
| CN | 107863316 A | 3/2018 |
| CN | 108461438 A | 8/2018 |
| CN | 109065677 A | 12/2018 |
| CN | 109755162 A | 5/2019 |
| CN | 109950182 A | 6/2019 |

\* cited by examiner

LIGHT EMITTING DIODES HAVING DIFFERENT SHAPES WITH EACH HAVING CORRESPONDING SHAPE WITH RESPECTIVE PIXEL DEFINING LAYER OPENINGS AND A TRANSFER METHOD THEREOF

CROSS-REFERENCE TO RELATED APPLICATION

The present application claims the priority of Chinese patent application No. 201910643338.1 filed to the CNIPA on Jul. 17, 2019, the content of which is hereby incorporated by reference.

TECHNICAL FIELD

The present disclosure relates to, but is not limited to, the technical field of display, in particular to a light emitting diode, a display substrate and a transfer method.

BACKGROUND

Light Emitting Diode (LED) technology has developed for nearly 30 years, from an initial solid-state lighting power supply to a backlight in the display field then to an LED display screen, a solid foundation is provided for its wider application. With development of chip manufacturing and encapsulating technology, Mini Light Emitting Diode (Mini LED) display of about 50 microns to 60 microns and Micro Light Emitting Diode (Micro LED) display of less than 15 microns have gradually become a hot spot of a display panel. Micro LED (also referred to as uLED) display has obvious advantages such as low power consumption, high color gamut, high stability, high resolution, ultra-thin, easy to realize flexible display, and is expected to become a better display technology to replace Organic Light Emitting Diode (OLED) display.

SUMMARY

The following is a summary of the subject matter described in detail herein. This summary is not intended to limit the protection scope of the claims.

A light emitting diode includes a light emitting structure, and a first electrode bonding pad and a second electrode bonding pad connected with the light emitting structure, wherein the first electrode bonding pad and the second electrode bonding pad are configured to be bound to a display substrate; when emitting light of a first color, the light emitting structure has a first cross-sectional shape; when emitting light of a second color, the light emitting structure has a second cross-sectional shape different from the first cross-sectional shape; and when emitting light of a third color, the light emitting structure has a third cross-sectional shape different from the first cross-sectional shape and the second cross-sectional shape.

In an exemplary embodiment, the first cross-sectional shape includes a rectangle, the second cross-sectional shape includes an ellipse, and the third cross-sectional shape includes a diamond.

In an exemplary embodiment, the light emitting diode having a first cross-sectional shape is configured to fall into a positioning hole having the first cross-sectional shape opened on a first sub-pixel in a display substrate, the light emitting diode having a second cross-sectional shape is configured to fall into a positioning hole having the second cross-sectional shape opened on a second sub-pixel in the display substrate, and the light emitting diode having a third cross-sectional shape is configured to fall into a positioning hole having the third cross-sectional shape opened on a third sub-pixel.

In an exemplary embodiment, the first electrode bonding pad is configured to be bound to a first contact electrode of a display substrate, and the second electrode bonding pad is configured to be bound to a second contact electrode of the display substrate.

A display substrate includes multiple first sub-pixels, second sub-pixels and third sub-pixels which are periodically arranged, wherein each sub-pixel includes a driving circuit layer, and a first contact electrode, a second contact electrode and a pixel definition layer which are disposed on the driving circuit layer, the first contact electrode and the second contact electrode are configured to be bound to a light emitting diode, a positioning hole is disposed on the pixel definition layer, a positioning hole disposed on the first sub-pixel has a first cross-sectional shape, a positioning hole disposed on the second sub-pixel has a second cross-sectional shape different from the first cross-sectional shape, and a positioning hole disposed on the third sub-pixel has a third cross-sectional shape different from the first cross-sectional shape and the second cross-sectional shape.

In an exemplary embodiment, the cross-sectional shape of the positioning hole disposed on the first sub-pixel and a cross-sectional shape of a first light emitting diode emitting light of a first color are the same, the cross-sectional shape of the positioning hole disposed on the second sub-pixel and a cross-sectional shape of a second light emitting diode emitting light of a second color are the same, and the cross-sectional shape of the positioning hole disposed on the third sub-pixel and a cross-sectional shape of a third light emitting diode emitting light of a third color are the same.

In an exemplary embodiment, a depth of the positioning hole is greater than a height of the light emitting diode.

In an exemplary embodiment, a material of the pixel definition layer includes any one or more of following: silicon nitride, silicon oxide, and resin.

In an exemplary embodiment, a cross-sectional equivalent diameter of the positioning hole is 1.01 to 1.10 times of a cross-sectional equivalent diameter of the light emitting diode.

In an exemplary embodiment, the first cross-sectional shape includes a rectangle, the second cross-sectional shape includes an ellipse, and the third cross-sectional shape includes a diamond.

In an exemplary embodiment, the first contact electrode is configured to be bound to a first electrode bonding pad of the light emitting diode, and the second contact electrode is configured to be bound to a second electrode bonding pad of the light emitting diode.

In an exemplary embodiment, a positioning hole of the pixel definition layer is configured to, in a transfer process, enable the light emitting diode to fall into a designated position of the sub-pixel in a transfer process, enable a first electrode bonding pad of the light emitting diode to contact with the first contact electrode, and a second electrode bonding pad of the light emitting diode contact with the second contact electrode.

A transfer method is used for transferring multiple aforementioned light emitting diodes onto a display substrate; the display substrate includes multiple first sub-pixels, second sub-pixels and third sub-pixels which are periodically arranged, wherein each sub-pixel includes a driving circuit layer, and a first contact electrode, a second contact electrode and a pixel definition layer which are disposed on the driving circuit layer, the first contact electrode and the second contact electrode are configured to be bound to a light emitting diode, a positioning hole is disposed on the pixel definition layer, a positioning hole disposed on the first sub-pixel has a first cross-sectional shape, a positioning hole disposed on the second sub-pixel has a second cross-sectional shape different from the first cross-sectional shape, and a positioning hole disposed on the third sub-pixel has a third cross-sectional shape different from the first cross-sectional shape and the second cross-sectional shape. The transfer method includes: disposing the display substrate on an adsorption carrier plate, adsorbing, by a transport head, multiple light emitting diodes from a donor substrate; dropping, by the transport head, the multiple light emitting diodes onto the display substrate, the light emitting diodes falling into a positioning hole on the display substrate; absorbing and removing, by the transport head, a light emitting diode on the display substrate which does not fall into a positioning hole.

In an exemplary embodiment, absorbing, by the transport head, the multiple light emitting diodes from the donor substrate, includes: absorbing, by the transport head, multiple light emitting diodes having a same cross-sectional shape from the donor substrate.

In an exemplary embodiment, dropping, by the transport head, the multiple light emitting diodes onto the display substrate, the light emitting diodes falling into the positioning holes on the display substrate, includes: releasing, by the transport head, the multiple light emitting diodes having a same cross-sectional shape, the multiple light emitting diodes falling on the display substrate, and the multiple light emitting diodes falling into positioning holes with a matching cross-sectional shape on the display substrate.

In an exemplary embodiment, adsorbing and removing, by the transport head, a light emitting diode on the display substrate which does not fall into a positioning hole, includes: powering on the transport head again, and adsorbing and removing a light emitting diode on the display substrate which does not fall into a positioning holes due to a mismatched cross-sectional shape.

In an exemplary embodiment, before dropping, by the transport head, the multiple light emitting diodes onto the display substrate, the method further includes: aligning the light emitting diodes adsorbed on the transport head with the sub-pixels of the display substrate.

In an exemplary embodiment, after dropping, by the transport head, the multiple light emitting diodes onto the display substrate, the method further includes: driving, by a vibration mechanism, a carrying apparatus to vibrate.

In an exemplary embodiment, adsorbing, by the transport head, the multiple light emitting diodes from the donor substrate, includes: adsorbing, by the transport head, multiple first light emitting diodes, second light emitting diodes, and third light emitting diodes from the donor substrate.

In an exemplary embodiment, the light emitting diode falling into a positioning hole on the display substrate, includes: a first light emitting diode having a first cross-sectional shape falling into a positioning hole having a first cross-sectional shape on a first sub-pixel of the display substrate, a second light emitting diode having a second cross-sectional shape falling into a positioning hole having a second cross-sectional shape on a second sub-pixel of the display substrate, and a third light emitting diode having a third cross-sectional shape falling into a positioning hole having a third cross-sectional shape on a third sub-pixel of the display substrate.

Other aspects will become apparent upon reading and understanding the drawings and detailed description.

BRIEF DESCRIPTION OF DRAWINGS

Accompanying drawings are used to provide a further understanding of technical solutions of the present disclosure, and form a part of the specification. Together with embodiments of the present application, the accompanying drawings are used for explaining technical solutions of the present disclosure, and do not constitute a limitation on the technical solutions of the present disclosure. Shapes and sizes of various components in the drawings do not reflect true proportions, and the purpose is only for schematically describing contents of the present disclosure.

ILLUSTRATION OF THE REFERENCE SIGNS

100-Light emitting structure;
101-First electrode bonding pad;
102-Second electrode bonding pad;
103-Encapsulating housing;
200-Substrate;
201-First contact electrode;
202-Second contact electrode;
300-Driver circuit layer;
400-Pixel definition layer;
401-Positioning hole;
501-Transfer plate;
502-Transport head;
503-Controller;
600-Micro LED.

DETAILED DESCRIPTION

Embodiments herein may be implemented in multiple different forms. An ordinary skilled in the art may easily understand a fact that an implementation and a content may be converted to various forms without departing from the essence and scope of the present disclosure. Therefore, the present disclosure should not be construed as limited only to what is recorded in following embodiments. Embodiments in the present disclosure and features in the embodiments may be combined with each other arbitrarily if there is no conflict.

One of technical difficulties in Micro LED display technology is a massive transfer technology. Micro LED can only be prepared by epitaxial growth, but how to transfer the Micro LED from an initial epitaxial substrate to a display substrate simply and reliably has always been a difficult problem in the industry, which hinders development of Micro LED display. The massive transfer technology includes transfer head transfer, laser assisted transfer, etc. The transfer head transfer is to grab the Micro LED by electrostatic adsorption or Van der Waals' force, etc., and to release the Micro LED to a designated position, and then performing bonding. Because precise positioning between Micro LEDs and sub-pixels of the display substrate is required, the quantity of Micro LEDs grabbed by a transport head at one time is few, the transfer efficiency is low, the transfer time is long, the transfer process is complex, the production cost is high, which is not suitable for large-scale mass production.

Figure 1:
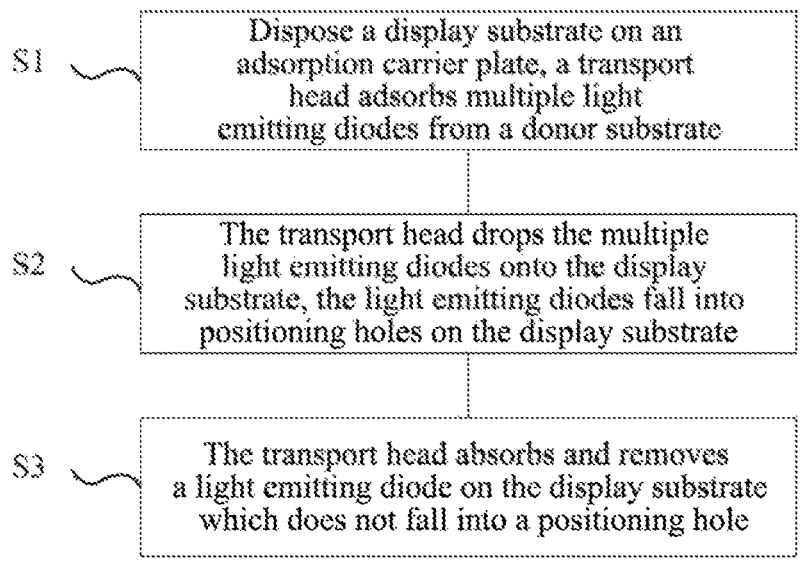
FIG. 1 is a flowchart of a transfer method according to an exemplary embodiment of the present disclosure.

FIG. 1 is a flowchart of a transfer method according to an exemplary embodiment of the present disclosure. As shown in FIG. 1, in an exemplary embodiment, a transfer method may include: S1, disposing a display substrate on an adsorption carrier plate, adsorbing, by a transport head, multiple light emitting diodes from a donor substrate; S2, dropping, by the transport head, the multiple light emitting diodes onto the display substrate, the light emitting diodes falling into positioning holes on the display substrate; S3, absorbing and removing, by the transport head, a light emitting diode on the display substrate which does not fall into a positioning hole.

In an exemplary embodiment, multiple first light emitting diodes regularly arranged are placed on a donor substrate, and the display substrate includes first sub-pixels, second sub-pixels and third sub-pixels arranged periodically. The first light emitting diode has a first cross-sectional shape, and the first sub-pixel is provided with a positioning hole having the first cross-sectional shape.

In an exemplary embodiment, absorbing, by the transport head, the multiple light emitting diodes from the donor substrate, may include: absorbing, by the transport head, multiple light emitting diodes having a same cross-sectional shape from the donor substrate.

In an exemplary embodiment, dropping, by the transport head, the multiple light emitting diodes onto the display substrate, the light emitting diodes falling the positioning holes on the display substrate, may include: releasing, by the transport head, multiple light emitting diodes with a same cross-sectional shape, the multiple light emitting diodes falling on the display substrate, and the multiple light emitting diodes falling into positioning holes with a matching cross-sectional shape on the display substrate.

In an exemplary embodiment, absorbing and removing, by the transport head, a light emitting diode on the display substrate which does not fall into a positioning hole, may include: powering on the transport head, and adsorbing and removing a light emitting diode on the display substrate which does not fall into a positioning hole due to a mismatched cross-sectional shape.

In an exemplary embodiment, multiple first light emitting diodes, second light emitting diodes and third light emitting diodes periodically arranged are disposed on a donor substrate, and the display substrate includes first sub-pixels, second sub-pixels and third sub-pixels periodically arranged. The first light emitting diode has a first cross-sectional shape, and the first sub-pixel is provided with a positioning hole having the first cross-sectional shape; the second light emitting diode has a second cross-sectional shape different from the first cross-sectional shape, and the second sub-pixel is provided with a positioning hole having the second cross-sectional shape; the third light emitting diode has a third cross-sectional shape different from the first cross-sectional shape and the second cross-sectional shape, and the third sub-pixel is provided with a positioning hole having the third cross-sectional shape.

In an exemplary embodiment, before the transport head drops the multiple light emitting diodes on the display substrate, the method may further include: aligning the light emitting diodes adsorbed on the transport head with the sub-pixels of the display substrate.

In an exemplary embodiment, after the transport head drops the multiple light emitting diodes onto the display substrate, the method may further include: driving, by a vibration mechanism, a carrying apparatus to vibrate.

In an exemplary embodiment, adsorbing, by the transport head, the multiple light emitting diodes from the donor substrate, may include: adsorbing, by the transport head, multiple first light emitting diodes, second light emitting diodes, and third light emitting diodes from the donor substrate.

In an exemplary embodiment, the light emitting diode falling into a positioning hole on the display substrate, may include: a first light emitting diode having a first cross-sectional shape falling into a positioning hole having a first cross-sectional shape on a first sub-pixel of the display substrate, a second light emitting diode having a second cross-sectional shape falling into a positioning hole having a second cross-sectional shape on a second sub-pixel of the display substrate, and a third light emitting diode having a third cross-sectional shape falling into a positioning hole having a third cross-sectional shape on a third sub-pixel of the display substrate.

The present disclosure provides a transfer method, wherein light emitting diodes of different colors are set to have different cross-sectional shapes in advance, positioning holes of different cross-sectional shapes are disposed within sub-pixels of different colors on a display substrate, accurate positioning of each light emitting diode is ensured through a positioning role of the positioning holes in a transfer process, positioning accuracy is improved, and this can not only effectively increase the quantity of light emitting diodes grabbed by a transport head at one time, and improve transfer efficiency, but also effectively shorten transfer time, improve productivity, and reduce production cost.

Figure 2A:
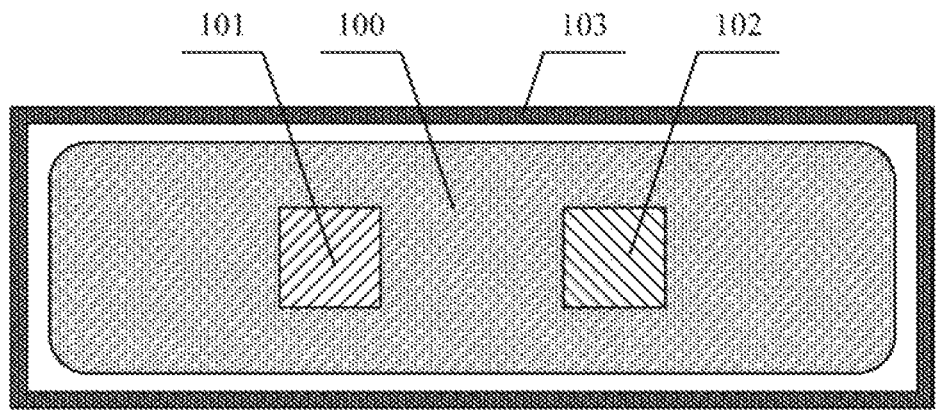
FIGS. 2a, 2b and 2c are schematic structural diagrams of Micro LED according to exemplary embodiments of the present disclosure.
Figure 2B:
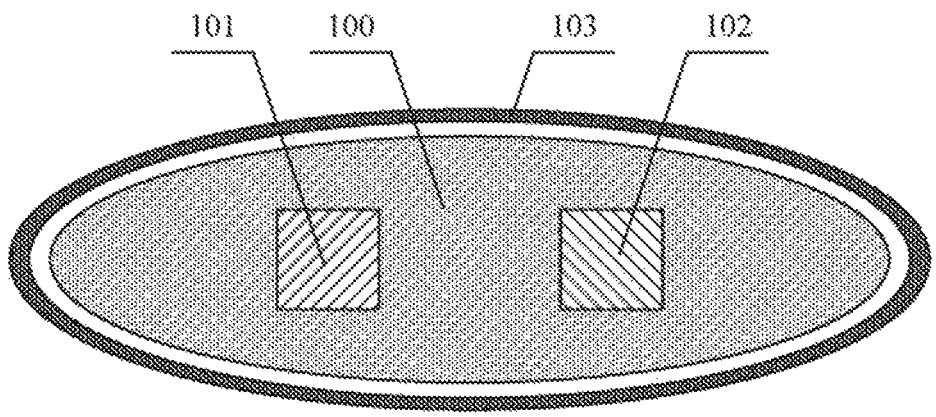
Figure 2C:
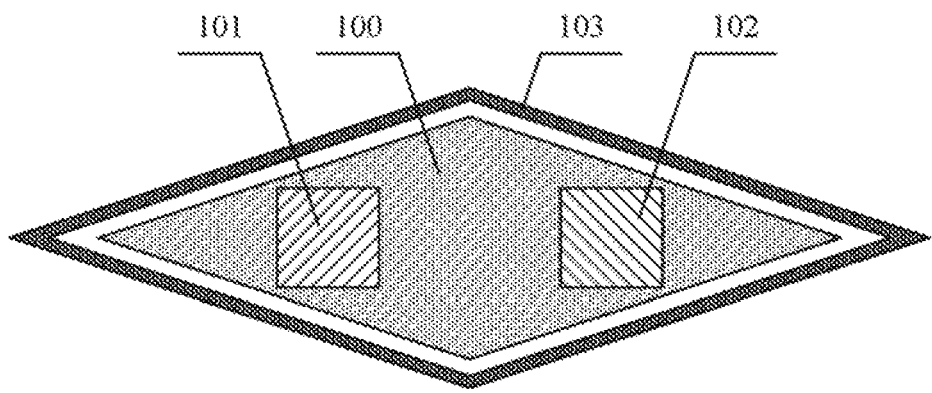

In an exemplary embodiment, the Micro LED may be set to different cross-sectional shapes according to different light emitting colors. FIGS. 2a, 2b and 2c are schematic structural diagrams of Micro LED according to exemplary embodiments of the present disclosure. In an exemplary embodiment, the Micro LED includes a light emitting structure 100, a first electrode bonding pad 101 and a second electrode bonding pad 102 electrically connected with the light emitting structure 100, and an encapsulating housing 103 which encapsulates the light emitting structure 100, the first electrode bonding pad 101 and the second electrode bonding pad 102. In an exemplary embodiment, the first electrode bonding pad 101 and the second electrode bonding pad 102 are configured to be bound to a first contact electrode and a second contact electrode of the display substrate, the first electrode bonding pad 101 and the second electrode bonding pad 102 may be P electrode bonding pad and N electrode bonding pad, respectively, or may be N electrode bonding pad and P electrode bonding pad, respectively. The light emitting structure 100 may be a first light emitting structure emitting light of a first color and having a first cross-sectional shape, forming a first Micro LED, or may be a second light emitting structure emitting light of a second color and having a second cross-sectional shape, forming a second Micro LED, or may be a third light emitting structure emitting light of a third color and having a third cross-sectional shape, forming a third Micro LED. Thus the first Micro LED has the first cross-sectional shape, the second Micro LED has the second cross-sectional shape, the third Micro LED has the third cross-sectional shape, and the first cross-sectional shape, the second cross-sectional shape and the third cross-sectional shape are different from each another.

According to an exemplary embodiment of the present disclosure, Micro LEDs emitting different colors are set to different cross-sectional shapes, such that Micro LEDs of corresponding colors are matched with sub-pixels of corresponding colors on a display substrate in a transfer process. Micro LEDs with a first cross-sectional shape may only fall into a positioning hole with the first cross-sectional shape opened on a first sub-pixel, Micro LEDs with a second cross-sectional shape may only fall into a positioning hole with the second cross-sectional shape opened on a second sub-pixel, and Micro LEDs with a third cross-sectional shape may only fall into a positioning hole with the third cross-sectional shape opened on a third sub-pixel, that is, the cross-sectional shape of the Micro LED and a cross-sectional shape of the positioning hole into which the Micro LED falls are the same. In an exemplary embodiment, the cross section mentioned in the present disclosure refers to a plane perpendicular to a light emitting direction of the Micro LED, or refers to a plane parallel to the display substrate. In an exemplary embodiment, the first Micro LED may be a red Micro LED, the second Micro LED may be a green Micro LED, and the third Micro LED may be a blue Micro LED. In some possible implementations, the light emitting structure 100 may include a fourth color light emitting structure, forming a fourth Micro LED, wherein the fourth Micro LED may be a white Micro LED.

In an exemplary embodiment, preparing a Micro Light Emitting Diode (Micro LED) may include: growing a buffer layer on a substrate, an N-type semiconductor layer is grown on the buffer layer, a multi-quantum well is grown on the N-type semiconductor layer, and a P-type semiconductor layer is grown on the multi-quantum well; then a step is formed on the N-type semiconductor layer, an N electrode bonding pad is prepared on the N-type semiconductor layer, a P electrode bonding pad is prepared on the P-type semiconductor layer, and multiple light emitting diodes are formed on a substrate through etching; and finally an encapsulating housing encapsulating each light emitting diode is formed through an encapsulating process, wherein the N electrode bonding pad and the P electrode bonding pad are located outside the encapsulating housing, and are configured to be bound to the display substrate. In an exemplary embodiment, the buffer layer, the N-type semiconductor layer, the multi-quantum well, and the P-type semiconductor layer together constitute a light emitting structure, and the N electrode bonding pad and the P electrode bonding pad are connected with the light emitting structure. In an exemplary embodiment, when multiple light emitting diodes are formed by etching, Micro LEDs of different colors are etched into different cross-sectional shapes according to colors of the light emitting diodes and pixel sizes required for matching. In some possible implementations, Micro LED of different colors may be etched into different cross-sectional shapes by adjusting corresponding mask plates. Finally, the fabricated Micro LED is separated from the substrate to complete the preparation of the required Micro LED. In some possible implementations, Micro LED with a specific cross-sectional shape may be prepared in another mode, which is not limited in the present disclosure.

In an exemplary embodiment, a cross-sectional shape of a red Micro LED is rectangular, as shown in FIG. 2a; a cross-sectional shape of a green Micro LED is oval, as shown in FIG. 2b; and a cross-sectional shape of a blue Micro LED is diamond, as shown in FIG. 2c. In some possible implementations, the red Micro LED, the green Micro LED or the blue Micro LED may be designed into other cross-sectional shapes according to actual an requirement, and the other cross-sectional shapes include any one or more of following: square, circular and triangular, as long as the cross-sectional shapes of the three Micro LEDs are different, and this is not restricted in the present disclosure.

After preparation of red Micro LEDs, green Micro LEDs and blue Micro LEDs with different cross-sectional shapes is completed, multiple Micro LEDs are arranged according to a spacing required for transfer on a donor substrate, and multiple Micro LEDs are periodically arranged on the donor substrate, the periodic arrangement mode of the multiple Micro LEDs is the same as the periodic arrangement mode of the multiple sub-pixels of the display substrate, forming a donor substrate of an exemplary embodiment of the present disclosure.

Figure 3:
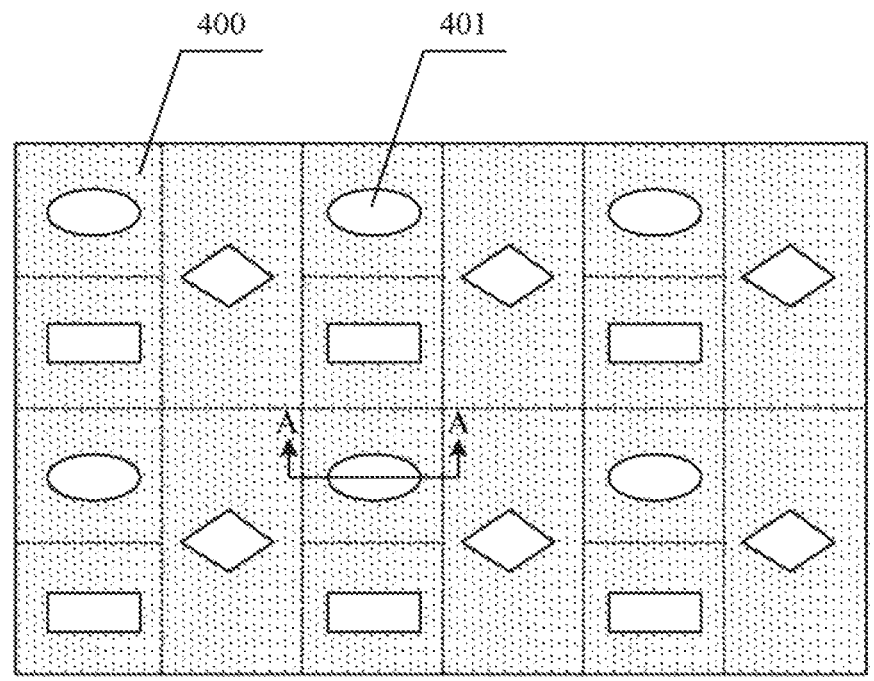
FIG. 3 is a schematic structural diagram of a display substrate according to an exemplary embodiment of the present disclosure.
Figure 4:
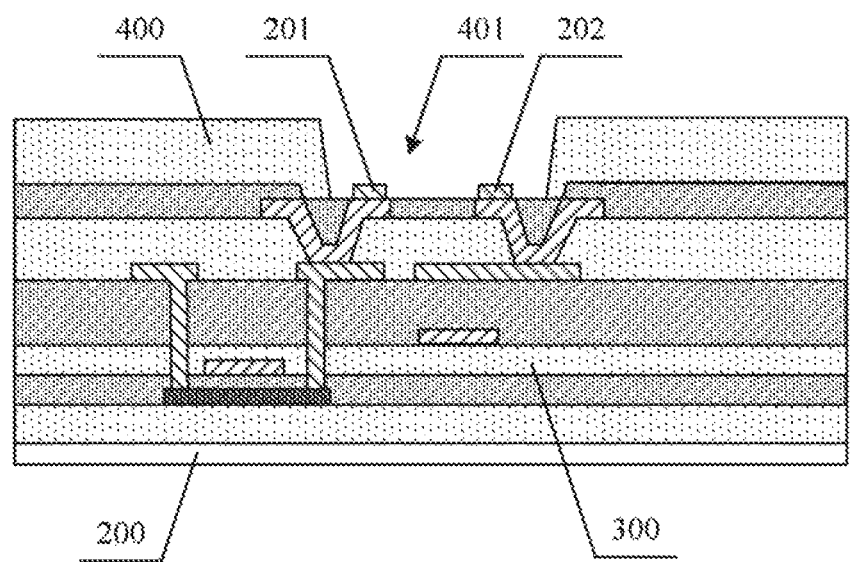
FIG. 4 is a sectional view of an A-A direction in FIG. 3.

FIG. 3 is a schematic structural diagram of a display substrate according to an exemplary embodiment of the present disclosure, and FIG. 4 is a sectional view of an A-A direction in FIG. 3. In an exemplary embodiment, a pixel definition layer is added on the display substrate, wherein multiple positioning holes are opened on the pixel definition layer. As shown in FIGS. 3 and 4, on a plane parallel to the display substrate, the display substrate includes multiple pixel units arranged in a matrix, each pixel unit including a first sub-pixel, a second sub-pixel and a third sub-pixel, forming the first sub-pixel, the second sub-pixel and the third sub-pixel periodically arranged on the substrate 200. On a plane perpendicular to the display substrate, each sub-pixel includes a substrate 200, a drive circuit layer 300 disposed on the substrate 200, a first contact electrode 201, a second contact electrode 202 and a pixel definition layer 400 disposed on the drive circuit layer 300, and a positioning hole 401 is opened on the pixel definition layer 400. In an exemplary embodiment, the first contact electrode 201 and the second contact electrode 202 are configured to be bound to a first electrode bonding pad and a second electrode bonding pad of a Micro LED, and the first contact electrode 201 and the second contact electrode 202 may be a P contact electrode and an N contact electrode, respectively, or may be an N contact electrode and a P contact electrode, respectively. The positioning hole 401 of the pixel definition layer 400 is configured to enable the Micro LED to fall into a designated position of the sub-pixel accurately in a transfer process, ensuring that the first electrode bonding pad of the Micro LED is in contact with the first contact electrode of the display substrate and the second electrode bonding pad of the Micro LED is in contact with the second contact electrode of the display substrate.

In an exemplary embodiment, the positioning hole 401 of the pixel definition layer in the first sub-pixel has a first cross-sectional shape, the positioning hole 401 of the pixel definition layer in the second sub-pixel has a second cross-sectional shape, and the positioning hole 401 of the pixel definition layer in the third sub-pixel has a third cross-sectional shape, wherein the first cross-sectional shape, the second cross-sectional shape, and the third cross-sectional shape are different from each another. In an exemplary embodiment, the cross-sectional shape of the positioning hole 401 of the pixel definition layer in the first sub-pixel and the cross-sectional shape of a first Micro LED emitting light of a first color are the same, the cross-sectional shape of the positioning hole 401 of the pixel definition layer in the second sub-pixel and the cross-sectional shape of a second Micro LED emitting light of a second color are the same, and the cross-sectional shape of the positioning hole 401 of the pixel definition layer in the third sub-pixel and the cross-sectional shape of a third Micro LED emitting light of a third color are the same. In some possible implementations, the sizes of cross-sections of the Micro LEDs of three colors and positions set on the display substrate may be accurately designed according to brightness of the Micro LEDs of three colors, to meet a display requirement.

According to an exemplary embodiment of the present disclosure, the positioning holes of different sub-pixels are set to be of different cross-sectional shapes, and are configured to match sub-pixels of corresponding colors on the display substrate with Micro LEDs of corresponding colors in a transfer process. Only when a cross-sectional shape of a Micro LED is the same as that of a positioning hole, the Micro LED can fall into the positioning hole. That is, the positioning hole with the first cross-sectional shape can only allow the Micro LED with the first cross-sectional shape to fall into its positioning hole, the positioning hole with the second cross-sectional shape can only allow the Micro LED with the second cross-sectional shape to fall into its positioning hole, and the positioning hole with the third cross-sectional shape can only allow the Micro LED with the third cross-sectional shape to fall into its positioning hole. In some possible implementations, the pixel unit may further include a fourth sub-pixel, such as a white sub-pixel.

In an exemplary embodiment, a material of the pixel definition layer may adopt Silicon Nitride (SiNx), Silicon Oxide (SiOx) or resin, or other relatively stable materials, so as not to affect light emission and stable working of the Micro LED. A thickness of the pixel definition layer is greater than a height of the Micro LED, that is, a depth of the positioning hole on the pixel definition layer is greater than the height of the Micro LED. In this way, once the Micro LED falls into the positioning hole, the Micro LED is located below a surface of the pixel definition layer. In some possible implementations, the thickness of the pixel definition layer may be designed according to the height of the Micro LED and a magnitude of electrostatic force of a transport head, as long as the Micro LED falling in the positioning hole will not be adsorbed when the transport head applies the electrostatic force again.

In an exemplary embodiment, preparing a display substrate may include: firstly, a drive circuit layer is prepared on a substrate, wherein the drive circuit layer includes a Thin Film Transistor (TFT) and a common electrode, and then a first contact electrode connected with a drain electrode of the thin film transistor and a second contact electrode connected with the common electrode are prepared on the drive circuit layer. In an exemplary embodiment, after the preparation of the first contact electrode and the second contact electrode is completed, a pixel definition layer with a positioning hole opened thereon is formed through a patterning process. The positioning hole is configured to match a sub-pixel of a corresponding color on the display substrate with a Micro LED of a corresponding color in a transfer process, and the Micro LED can fall into the positioning hole only if a cross-sectional shape of the Micro LED is the same as that of the positioning hole.

In an exemplary embodiment, the preparation process of the display substrate may include: (1) a buffer layer is formed on the substrate 200; (2) an active layer is formed on the buffer layer through a patterning process; (3) a first insulating layer covering the active layer and a first gate electrode disposed on the first insulating layer are formed; (4) a second insulating layer covering the first gate electrode and a second gate electrode disposed on the second insulating layer are formed; (5) a third insulating layer covering the second gate electrode is formed, wherein two first via-holes exposing the active layer are opened on the third insulating layer; (6) a source electrode, a drain electrode and a common electrode are formed on the third insulating layer, wherein the source electrode and the drain electrode are respectively connected with the active layer through the first via-hole; (7) a fourth insulating layer covering the source electrode, the drain electrode and the common electrode is formed, two second via-holes exposing the drain electrode and the common electrode are opened on the fourth insulating layer; (8) a first electrode and a second electrode are formed on the fourth insulating layer, wherein the first electrode is connected with the drain electrode through a second via-hole, and the second electrode is connected with the common electrode through another second via-hole; (9) a fifth insulating layer is formed, wherein a third via-hole exposing the first electrode and the second electrode is opened on the fifth insulating layer. In an exemplary embodiment, a structure from the buffer layer to the fifth insulating layer is referred to as the driving circuit layer 300; (10) a first contact electrode 201 and a second contact electrode 202 are formed within the third via-hole of the fifth insulating layer, wherein the first contact electrode 201 is connected with the first electrode, and the second contact electrode 202 is connected with the second electrode; (11) a layer of pixel definition film is deposited or coated, and the pixel definition layer 400 is formed by patterning the pixel definition film, wherein in the pixel definition layer 400, a positioning hole is formed on each sub-pixel, and the positioning hole exposes the first contact electrode 201 and the second contact electrode 202. In an exemplary embodiment, the positioning hole of each sub-pixel has a different cross-sectional shape, the cross-sectional shape of the positioning hole in the first sub-pixel is the same as that of the first Micro LED, the cross-sectional shape of the positioning hole in the second sub-pixel is the same as that of the second Micro LED, and the cross-sectional shape of the positioning hole in the third sub-pixel is the same as that of the third Micro LED.

In an exemplary embodiment, it may be set that the first sub-pixel is a red sub-pixel, the cross-sectional shape of the positioning hole is rectangular; the second sub-pixel is a green sub-pixel, the cross-sectional shape of the positioning hole is oval; the third sub-pixel is a blue sub-pixel, and the cross-sectional shape of the positioning hole is diamond-shaped, as shown in FIG. 3. In some possible implementations, the positioning holes in the red sub-pixel, the green sub-pixel or the blue sub-pixel may be designed to be of another cross-sectional shape according to an actual requirement, including any one or more of following: square, circular and triangular, as long as the cross-sectional shapes of the positioning holes in the three sub-pixels are different, but the cross-sectional shapes of the positioning holes in the sub-pixels and the cross-sectional shapes of the Micro LEDs of a same color are the same. In some possible implementations, in order to ensure that the Micro LED smoothly falls into the positioning hole, a cross-sectional size of the positioning hole may be set to be slightly larger than that of the Micro LED, an equivalent diameter of the cross-section for the Micro LED is D, and the equivalent diameter of the cross-section of the positioning hole is set to be 1.01-1.10D.

An exemplary explanation is given below through a Micro LED transfer process.

(1) A donor substrate and a display substrate are respectively prepared. The process related to preparing the donor substrate and preparing the display substrate has been described in detail above. The prepared donor substrate may include multiple first Micro LEDs regularly arranged, wherein the first Micro LED has a first cross-sectional shape. The prepared display substrate may include multiple first sub-pixels, second sub-pixels and third sub-pixels periodically arranged, wherein the first sub-pixel is provided with a positioning hole having a first cross-sectional shape, the second sub-pixel is provided with a positioning hole having a second cross-sectional shape, and the third sub-pixel is provided with a positioning hole having a third cross-sectional shape. In an exemplary embodiment, there is no timing requirement for preparing the donor substrate and preparing the display substrate, and both may be performed simultaneously. In some possible implementations, the quantity of adsorbed first Micro LEDs may be greater than the quantity of the first sub-pixels on the display substrate.

Figure 5:
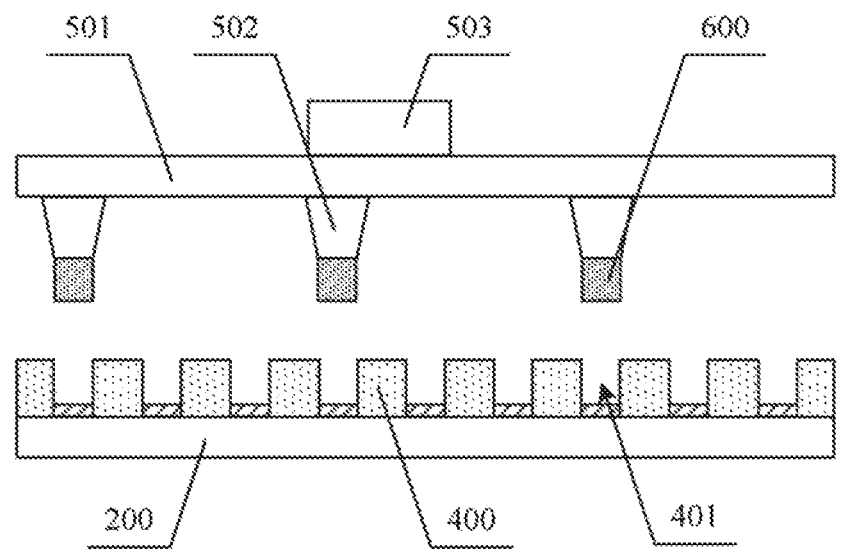
FIG. 5 is a schematic diagram of a transport head adsorbing a first Micro LED according to an exemplary embodiment of the present disclosure.

(2) All the first Micro LEDs are absorbed by a transport head from the donor substrate, and moved to be above the display substrate and simply aligned. FIG. 5 is a schematic diagram of a transport head adsorbing a first Micro LED according to an exemplary embodiment of the present disclosure. In an exemplary embodiment, a transfer equipment may include a transfer plate 501, a transport head 502, and a controller 503. Multiple micro-device transport heads are disposed on a surface of the transfer plate, each transport head is provided with an array electrode, and the controller is configured to apply a voltage to the array electrode on the transport head to enable the array electrode to be charged and generate electrostatic force to adsorb a Micro LED 600, and control the transfer plate to move to be above the display substrate, the adsorbed Micro LED faces toward a display substrate below. The display substrate may be disposed on a carrying apparatus, and a pixel definition layer 400 of the display substrate faces toward a transport head above, i.e., a positioning hole 401 of the pixel definition layer 400 faces toward a Micro LED above, as shown in FIG. 5. When the transport head adsorbing first Micro LEDs is away from the display substrate by a certain distance, alignment is started, positions of the first Micro LEDs arranged on the transport head correspond to positions of first sub-pixels arranged on the display substrate one by one, and the position of each first Micro LED corresponds to a position of a positioning hole.

(3) The transport head gradually approaches the display substrate. When an end of the first Micro LED adsorbed on the transport head is separated from a surface of the pixel definition layer on the display substrate by a set distance, the controller stops applying voltage to the array electrode of the transport head, so that the electrostatic force of the transport head disappears, and multiple first Micro LEDs fall onto the corresponding first sub-pixels on the display substrate under its own gravity, and fall into the positioning holes of the first sub-pixels.

Since the positions of the first Micro LEDs regularly arranged on the transport head correspond to the positions of the first sub-pixels periodically arranged on the display substrate one by one, and the cross-sectional shape of the first Micro LED is the same as the cross-sectional shape of the positioning hole opened in the first sub-pixel, after the first Micro LED falls into the first sub-pixel, the first Micro LED having the first cross-sectional shape falls into the positioning hole having the first cross-sectional shape of the first sub-pixel on the display substrate. When the cross-sectional shape of the first Micro LED does not match with the cross-sectional shape of the positioning hole, the first Micro LED cannot fall into the positioning hole. Due to a positioning role of the positioning hole, it is effectively ensured that the Micro LED falls to the corresponding sub-pixel and is located at a corresponding position, thus ensuring that the first electrode bonding pad of the Micro LED has a good contact with the first contact electrode of the sub-pixel, and the second electrode bonding pad of the Micro LED has a good contact with the second contact electrode of the sub-pixel.

In some possible implementations, a vibration mechanism may be disposed on the carrying apparatus. After the first Micro LED falls onto the display substrate, the vibration mechanism drives the carrying apparatus to vibrate, adjusts a posture of the first Micro LED, improves a probability of the first Micro LED falling into a positioning hole, promotes smooth degree of the first Micro LED falling into the positioning hole, and enhances good contact of the electrode bonding pad of the first Micro LED with the contact electrode of the sub-pixel.

(4) The controller reapplies voltage to the array electrode on the transport head to restore the electrostatic force of the transport head, and the first Micro LED on the display substrate which does not fall into the positioning hole is reabsorbed by the transport head, and removed.

In an exemplary embodiment, due to existence of the pixel definition layer, the first Micro LED falling into the positioning hole has a certain distance from the transport head, thus the first Micro LED falling into the positioning hole cannot be grasped through the electrostatic force of the transport head again. In an exemplary embodiment, since the depth of the positioning hole is greater than the height of the Micro LED, once the first Micro LED falls into the positioning hole, the first Micro LED is located below the surface of the pixel definition layer, while the first Micro LED which does not fall into the positioning hole due to an inconsistent cross-sectional shape is scattered on the surface of the pixel definition layer. In this way, there is a certain distance difference between the first Micro LED falling into the positioning hole and the first Micro LED not falling into the positioning hole, which may ensure that the first Micro LED having fallen into the positioning hole will not be sucked away when the transport head grabs the first Micro LED located on the surface of the pixel definition layer again.

After that, the above transfer processing is repeatedly performed on the second Micro LED and the third Micro LED to complete the transfer of all Micro LEDs. Micro LEDs of different colors are respectively transferred, which may simplify the arrangement of the Micro LEDs on the donor substrate, and facilitate the Micro LEDs falling into the positioning holes.

After the transfer of all Micro LEDs is completed, follow-up processing such as soldering and encapsulating is performed. In an exemplary embodiment, solder paste is coated on the first contact electrode and the second contact electrode of the display substrate after the pixel definition layer is manufactured, and the first electrode bonding pad and the second electrode bonding pad on the Micro LED is connected with the first contact electrode and the second contact electrode on the display substrate through a reflow soldering process after the transfer of the Micro LED is completed. In an exemplary embodiment, encapsulating is performed to improve stability of the Micro LED after the transfer of the Micro LED, connection and inspection and repairing are completed. The encapsulating process may take many modes, including covering a cover plate, coating an organic resin, etc. In an exemplary embodiment, the pixel definition layer may not be removed, and the pixel definition layer may be used as a support for encapsulating the cover plate, which may improve the encapsulation effect of the Micro LED. The specific soldering and encapsulating process will not be repeated here.

In an exemplary embodiment of the present disclosure, by setting Micro LEDs of different colors to have different cross-sectional shapes in advance, positioning holes of different cross-sectional shapes are set within sub-pixels of different colors on a display substrate, accurate positioning of each Micro LED is ensured through a positioning role of the positioning holes in a transfer process, positioning accuracy is improved, and this can not only effectively increase a quantity of Micro LEDs grabbed by a transport head at one time, and improve transfer efficiency, but also effectively shorten transfer time, improve productivity, and reduce production cost. According to an exemplary embodiment of the present disclosure, by disposing the positioning holes, a distance difference is generated between the Micro LEDs falling into the positioning holes and the Micro LEDs not falling into the positioning holes, when the transport head grabs the Micro LEDs again, neither the selectively-grabbing is required, nor the Micro LEDs having fallen into the positioning holes will be touched. Therefore massive transfer of the Micro LEDs becomes fast, simple, easy to operate, and convenient for large-scale mass production, reducing damage to the Micro LEDs, ensuring transfer reliability, improving yield, reducing subsequent detection and update requirements, and further reducing production cost.

An exemplary embodiment of the present disclosure has low process difficulty, is easy to implement, and is suitable for large-scale mass production with any size, any shape, and any batch. In an exemplary embodiment, the transport head may adopt a large transport head, and may grab all Micro LEDs required by a certain display backplane or all Micro LEDs of a certain substrate at one time, it has a higher selectivity of a transfer mode, is favorable for mass production, and has very strong realization. The light emitting diode and the display substrate provided by an exemplary embodiment of the disclosure may be realized by using an existing mature equipment, they have good process compatibility, and have advantages such as simple process, easy realization, high production efficiency, low production cost, high yield.

The aforementioned Micro LED transfer process is only an exemplary illustration, but is not used for limiting the transfer method of the present disclosure. The above transfer method may be adjusted correspondingly according to an actual situation. In some possible implementations, the donor substrate includes multiple first Micro LEDs, second Micro LEDs and third Micro LEDs which are periodically arranged, and periodic arrangement modes of the first Micro LEDs, the second Micro LEDs and the third Micro LEDs are the same as those of the first sub-pixel, the second sub-pixel and the third sub-pixel. The transport head grasps all the first Micro LEDs, the second Micro LEDs and the third Micro LEDs from the donor substrate at one time, and after simple alignment, the multiple first Micro LEDs, second Micro LEDs and third Micro LEDs are sprinkled on the display substrate. The vibration mechanism drives the carrying apparatus to vibrate, so that the first Micro LEDs fall into the positioning holes of the first sub-pixels, the second Micro LEDs fall into the positioning holes of the second sub-pixels, and the third Micro LEDs fall into the positioning holes of the third sub-pixels. Then the transport head restores the electrostatic force, and adsorbs and removes the remaining Micro LEDs on the display substrate.

An exemplary embodiment of the present disclosure has a characteristic of simple rework mechanism. As the transfer process adopts shape matching, for missing sub-pixels, a second time of transfer may be performed, and a process of the first time of transfer may be repeated. Therefore, the transfer mode for shape matching according to an exemplary embodiment of the present disclosure provides a simple and convenient rework mechanism.

In the description of the present disclosure, it need be understood that, an orientation or position relationship indicated by terms "middle", "upper", "lower", "front", "rear", "vertical", "horizontal", "top", "bottom", "inside", "outside", or the like is based on the orientation or position relationship shown in the drawings, and this is only for ease of description of the present disclosure and simplification of the description, rather than indicating or implying that the referred apparatus or element must have a specific orientation, or be constructed and operated in a particular orientation, and therefore this cannot be understood as a limitation on the present disclosure.

In the description of the present disclosure, it should be noted that unless otherwise explicitly specified and defined, terms "install", "communicate" and "connect" shall be understood broadly, for example, it may be fixedly connected, or may be removable connected, or may be integrally connected; it may be mechanically connected, or may be electrically connected; it may be directly connected, or may be indirectly connected through an intermediate medium, or it may be an internal connection of two elements. For those of ordinary skill in the art, the specific meanings of the above terms in the present disclosure may be understood according to a specific situation.

Although the embodiments disclosed in the present disclosure are as the above, the contents are only embodiments for facilitating understanding the present disclosure, rather than for restricting the present disclosure. Any person skilled in the field to which the present disclosure pertains may make any modifications and variations in the forms and details of implementation without departing from the spirit and the scope disclosed by the present disclosure. However, the patent protection scope of the present disclosure shall still be subject to the scope defined in the appended claims.

What is claimed is:

1. A light emitting diode, comprising a light emitting structure, and a first electrode bonding pad and a second electrode bonding pad connected with the light emitting structure, the first electrode bonding pad and the second electrode bonding pad being configured to be bound to a display substrate; wherein the light emitting structure comprises a first light emitting diode having a first cross-sectional shape and emitting light of a first color; a second light emitting diode having a second cross-sectional shape and emitting light of a second color; and a third light emitting diode having a third cross-sectional shape and emitting light of a third color, wherein the third cross-sectional shape, the first cross-sectional shape and the second cross-sectional shape are different from each other, wherein a cross-sectional shape of a positioning hole disposed on a first sub-pixel of a display substrate is same as the cross-sectional shape of the first light emitting diode emitting light of the first color, a cross-sectional shape of a positioning hole disposed on a second sub-pixel of the display substrate is same as the cross-sectional shape of the second light emitting diode emitting light of the second color, and a cross-sectional shape of a positioning hole disposed on a third sub-pixel of the display substrate is same as the cross-sectional shape of the third light emitting diode emitting light of the third color.

2. The light emitting diode according to claim 1, wherein the first cross-sectional shape comprises a rectangle, the second cross-sectional shape comprises an ellipse, and the third cross-sectional shape comprises a diamond.

3. The light emitting diode according to claim 1, wherein the light emitting diode having the first cross-sectional shape is configured to fall into the positioning hole having the first cross-sectional shape opened on the first sub-pixel in the display substrate, the light emitting diode having the second cross-sectional shape is configured to fall into the positioning hole having the second cross-sectional shape opened on the second sub-pixel in the display substrate, and the light emitting diode having the third cross-sectional shape is configured to fall into the positioning hole having the third cross-sectional shape opened on the third sub-pixel.

4. The light emitting diode according to claim 1, wherein the first electrode bonding pad is configured to be bound to a first contact electrode of the display substrate, and the second electrode bonding pad is configured to be bound to a second contact electrode of the display substrate.

5. A transfer method, for transferring a plurality of light emitting diodes according to claim 1 onto a display substrate; wherein the display substrate comprises a plurality of first sub-pixels, second sub-pixels and third sub-pixels which are periodically arranged, wherein each sub-pixel comprises a driving circuit layer, and a first contact electrode, a second contact electrode and a pixel definition layer which are disposed on the driving circuit layer, the first contact electrode and the second contact electrode are configured to be bound to a light emitting diode, a positioning hole is disposed on the pixel definition layer, a positioning hole disposed on the first sub-pixel has a first cross-sectional shape, a positioning hole disposed on the second sub-pixel has a second cross-sectional shape different from the first cross-sectional shape, and a positioning hole disposed on the third sub-pixel has a third cross-sectional shape different from the first cross-sectional shape and the second cross-sectional shape, wherein the cross-sectional shape of the positioning hole disposed on the first sub-pixel is same as a cross-sectional shape of a first light emitting diode emitting light of a first color, the cross-sectional shape of the positioning hole disposed on the second sub-pixel is same as a cross-sectional shape of a second light emitting diode emitting light of a second color, and the cross-sectional shape of the positioning hole disposed on the third sub-pixel is same as a cross-sectional shape of a third light emitting diode emitting light of a third color, wherein the transfer method comprises:

disposing the display substrate on an adsorption carrier plate, adsorbing, by a transport head, a plurality of light emitting diodes from a donor substrate;

dropping, by the transport head, the plurality of light emitting diodes onto the display substrate, the light emitting diodes falling into positioning holes on the display substrate;

absorbing and removing, by the transport head, a light emitting diode on the display substrate which does not fall into a positioning hole.

6. The transfer method according to claim 5, wherein, absorbing, by the transport head, the plurality of light emitting diodes from the donor substrate, comprises: absorbing, by the transport head, a plurality of light emitting diodes having a same cross-sectional shape from the donor substrate.

7. The transfer method according to claim 5, wherein, dropping, by the transport head, the plurality of light emitting diodes onto the display substrate, the light emitting diodes falling into positioning holes on the display substrate, comprises: releasing, by the transport head, the plurality of light emitting diodes having a same cross-sectional shape, the plurality of light emitting diodes falling on the display substrate, and the plurality of light emitting diodes falling into positioning holes having a matching cross-sectional shape on the display substrate.

8. The transfer method according to claim 5, wherein, adsorbing and removing, by the transport head, a light emitting diode on the display substrate which does not fall into a positioning hole, comprises: powering on the transport head again, and adsorbing and removing a light emitting diode on the display substrate which does not fall into a positioning hole due to a mismatched cross-sectional shape.

9. The transfer method according to claim 5, wherein before dropping, by the transport head, the plurality of light emitting diodes onto the display substrate, the method further comprises: aligning the light emitting diodes adsorbed on the transport head with the sub-pixels of the display substrate.

10. The transfer method according to claim 5, wherein after dropping, by the transport head, the plurality of light emitting diodes onto the display substrate, the method further comprises: driving, by a vibration mechanism, a carrying apparatus to vibrate.

11. The transfer method according to claim 5, wherein adsorbing, by the transport head, the plurality of light emitting diodes from the donor substrate, comprises: adsorbing, by the transport head, a plurality of first light emitting diodes, second light emitting diodes, and third light emitting diodes from the donor substrate.

12. The transfer method according to claim 11, wherein the light emitting diodes falling into positioning holes on the display substrate, comprises: a first light emitting diode having a first cross-sectional shape falling into a positioning hole having a first cross-sectional shape on a first sub-pixel of the display substrate, a second light emitting diode having a second cross-sectional shape falling into a positioning hole having a second cross-sectional shape on a second sub-pixel of the display substrate, and a third light emitting diode having a third cross-sectional shape falling into a positioning hole having a third cross-sectional shape on a third sub-pixel of the display substrate.

13. A display substrate, comprising a plurality of first sub-pixels, second sub-pixels and third sub-pixels which are periodically arranged, wherein each sub-pixel comprises a driving circuit layer, and a first contact electrode, a second contact electrode and a pixel definition layer which are disposed on the driving circuit layer, the first contact electrode and the second contact electrode are configured to be bound to a light emitting diode, a positioning hole is disposed on the pixel definition layer, a positioning hole disposed on the first sub-pixel has a first cross-sectional shape, a positioning hole disposed on the second sub-pixel has a second cross-sectional shape different from the first cross-sectional shape, and a positioning hole disposed on the third sub-pixel has a third cross-sectional shape different from the first cross-sectional shape and the second cross-sectional shape, wherein the cross-sectional shape of the positioning hole disposed on the first sub-pixel is same as a cross-sectional shape of a first light emitting diode emitting light of a first color, the cross-sectional shape of the positioning hole disposed on the second sub-pixel is same as a cross-sectional shape of a second light emitting diode emitting light of a second color, and the cross-sectional shape of the positioning hole disposed on the third sub-pixel is same as a cross-sectional shape of a third light emitting diode emitting light of a third color.

14. The display substrate according to claim 13, wherein a depth of the positioning hole is greater than a height of the light emitting diode.

15. The display substrate according to claim 13, wherein a material of the pixel definition layer comprises any one or more of following: silicon nitride, silicon oxide, and resin.

16. The display substrate according to claim 13, wherein a cross-sectional equivalent diameter of the positioning hole is 1.01 to 1.10 times of a cross-sectional equivalent diameter of the light emitting diode.

17. The display substrate according to claim 13, wherein the first cross-sectional shape comprises a rectangle, the second cross-sectional shape comprises an ellipse, and the third cross-sectional shape comprises a diamond.

18. The display substrate according to claim 13, wherein the first contact electrode is configured to be bound to a first electrode bonding pad of the light emitting diode, and the second contact electrode is configured to be bound to a second electrode bonding pad of the light emitting diode.

19. The display substrate according to claim 13, wherein a positioning hole of the pixel definition layer is configured to, in a transfer process, enable the light emitting diode to fall into a designated position of the sub-pixel, enable a first electrode bonding pad of the light emitting diode to contact with the first contact electrode, and a second electrode bonding pad of the light emitting diode to contact with the second contact electrode.

* * * * *